United States Patent [19]

Childs

[11] 4,348,648
[45] Sep. 7, 1982

[54] TRANSIENT SUPPRESSION CIRCUIT

[75] Inventor: Richard B. Childs, White Plains, N.Y.

[73] Assignee: Optical Information Systems, Inc., Elmsford, N.Y.

[21] Appl. No.: 60,722

[22] Filed: Jul. 25, 1979

[51] Int. Cl.³ .............................................. H01S 3/10
[52] U.S. Cl. .......................................... 372/29; 372/33
[58] Field of Search ................ 331/94.55 H; 307/311, 307/296, 297; 250/205

[56] References Cited

U.S. PATENT DOCUMENTS

| | | | |
|---|---|---|---|
| 3,898,583 | 8/1975 | Shuey | 372/29 |
| 3,946,335 | 4/1976 | DeLoach, Jr. et al. | 372/38 |
| 3,996,526 | 12/1976 | d'Auria et al. | 372/31 |
| 4,109,217 | 8/1978 | Brackett et al. | 372/38 |

OTHER PUBLICATIONS

"Precision AC/DC Converts", by Robert C. Dobkin, National Semiconductor Linear Applications, vol. 1, LB-8-1, Aug. 1969.

"Light Controllers Using Silicon Photocells", National Semiconductor Linear Databook, 1976, pp. 1-34.

Primary Examiner—William L. Sikes
Assistant Examiner—Leon Scott, Jr.
Attorney, Agent, or Firm—Arthur L. Plevy; Paul E. Purwin; David W. Collins

[57] ABSTRACT

A transient suppression circuit is provided for starting up or turning off a light emitting diode, such as a diode laser. The circuit minimizes the possibility of turn-on or turn-off transients or overshoot, employing a time delayed voltage. A diode circuit is used which generates an output voltage equal to the higher of two voltages at its two inputs, one input being the time delayed voltage and the second being derived from photodetector which detects electromagnetic radiation emitted by the light emitting diode. The circuit also utilizes a three terminal voltage regulator which maintains a constant voltage between its sense terminal (output from the diode circuit) and its output terminal.

8 Claims, 1 Drawing Figure

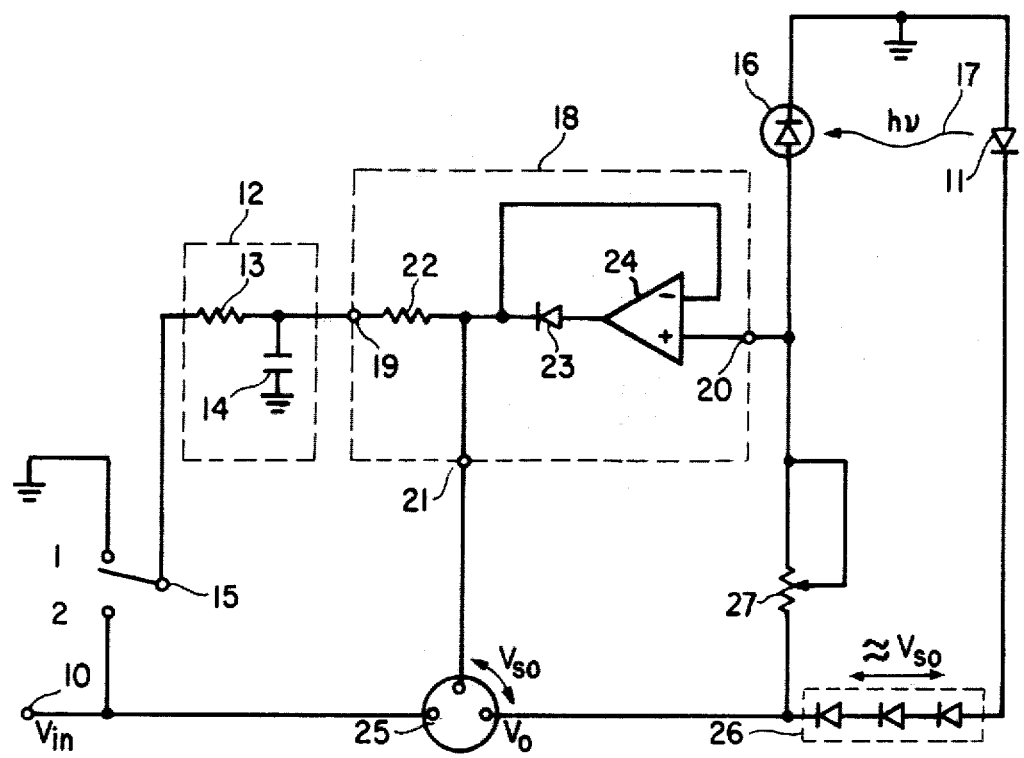

TRANSIENT SUPPRESSION CIRCUIT

BACKGROUND OF THE INVENTION

1. Field of the Invention

The invention relates to transient suppression circuits, and, in particular, to a circuit for suppressing transients or overshoot during turn-on/turn-off of a light emitting diode, such as a diode laser.

2. Prior Art

Optical feedback for regulating the output of diode lasers of, e.g., the double heterostructure gallium arsenide type, is well known. For example, d'Auria et al, U.S. Pat. No. 3,996,526, disclose an optical radiation generator which enables a linear light response to be obtained as a function of an electrical signal through the utilization of a current negative feedback loop. DeLoach, Jr. et al, U.S. Pat. No. 3,946,335 disclose a stabilization circuit for radiation emitting diodes which ensures that the radiated output does not exceed a critical value. Brackett et al, U.S. Pat. No. 4,109,217, disclose a stabilization circuit for junction lasers which is in many respects similar to the circuit disclosed by DeLoach, Jr. et al. Shuey, U.S. Pat. No. 3,898,583, discloses a laser stabilization technique in which the output power level of the laser is stabilized at a predetermined set point by a feedback control circuit.

A difficulty with all of the prior art optical feedback circuits is that in starting up or turning off a laser optical feedback power supply, transients or overshoot can occur even if the duration of such transients or overshoot is in the nanosecond range. Consequently, considerable damage, if not destruction, to the diode laser can occur.

SUMMARY OF THE INVENTION

In accordance with the invention, a transient suppression circuit is provided which minimizes the possibility of turn-on or turn-off transients or overshoot during turn-on or turn-off of a light emitting diode. The transient suppression circuit of the invention comprises:

(a) voltage input means for providing a bias to the light emitting diode, the voltage input means including a time delayed portion which provides a first voltage whose magnitude increases with time;

(b) detecting means operably associated with the light emitting diode for detecting electromagnetic radiation emitted by the light emitting diode, thereby generating a second voltage;

(c) a diode circuit operably associated with both the time delayed portion of the voltage input means and the detecting means for generating a voltage equal to the higher of the two voltages; and (d) voltage regulator means for regulating voltage to the light emitting diode and responsive to the voltage generated by the diode circuit.

BRIEF DESCRIPTION OF THE DRAWING

The FIGURE is a schematic diagram of a transient suppression circuit in accordance with the invention.

DETAILED DESCRIPTION OF THE INVENTION

A simplified schematic diagram of the transient suppression circuit of the invention is shown in the FIGURE. The circuit advantageously utilizes a diode circuit and a three-terminal voltage regulator. The diode circuit generates an output voltage which is substantially equal to the higher of two voltages at its two inputs. The voltage regulator maintains constant voltage ($V_{so}$) between its sense terminal (input from the diode circuit) and its output terminal.

The transient suppression circuit of the invention comprises voltage input means 10 for providing a bias or first voltage ($V_{in}$) to light emitting diode 11, one side of which is grounded. The light emitting diode may be any of the semiconducting light emitting diodes known in the art, and is preferably a diode laser, most preferably of the double heterostructure type fabricated from layers of gallium arsenide and gallium aluminum arsenide, such as described in U.S. Pat. Nos. 3,691,476; 3,733,561 and 3,758,875. The voltage bias on the diode here is negative to reflect the fact that the P-side is grounded. Grounding the N-side would require a positive bias.

The voltage input means includes a time delayed portion, provided by time delay circuit 12. As shown in the FIGURE, the time delay circuit may be an R-C network and may include a resistor 13 and capacitor 14. The values of the components of the time delay circuit are not critical, except that a time constant of about 0.001 to 1 sec, and preferably about 0.1 to 1 sec, must be provided, since a more rapid increase could generate transients or overshoot. The time delay circuit provides a voltage whose magnitude increases with time (i.e., ramps).

A two-position switch 15 controls turn-on/turn-off of the light emitting diode.

Detecting means 16 operably associated with the light emitting diode detects electromagnetic radiation 17 emitted by the light emitting diode and thereby generating a second voltage. Any of the detecting means commonly employed in the art may be used, such as a photodiode.

A diode circuit 18, operably associated with both the time delayed voltage input means and the detecting means, and capable of generating a voltage substantially equal to the higher of the two voltages is employed. Such diode circuits are well-known and form no part of this invention. Preferably, an ideal diode circuit is employed for sharper switching; an example of such a circuit is given in Vol. 1, National Semiconductor Linear Applications LB-8.

As shown in the FIGURE, the ideal diode circuit has two inputs, 19 and 20, and an output 21. Input 19 is connected to the time delay circuit 12; input 20 is connected to the detecting means 16. The ideal diode circuit depicted in the FIGURE is merely exemplary, and provides a voltage at output 21 which is substantially equal to the higher of the two voltages at inputs 19 and 20. Although any diode or ideal diode circuit providing this capability may be used, the one depicted in the FIGURE is conveniently employed. As shown in the FIGURE, the ideal diode circuit comprises a resistor 22, a diode 23 and an operational amplifier 24 in series with input 19. The diode 23 is the heart of the ideal diode circuit; the operational amplifier makes it act ideal. The non-inverting input of the operational amplifier is connected to input 20. The inverting input of the operational amplifier is connected to output 21, which is connected between the resistor and the diode. The values of the individual components of the ideal diode circuit are not critical, except that the diode circuit provides the capability set forth above.

Voltage regulator means 25 for regulating voltage to the light emitting diode is responsive to the voltage generated by the ideal diode circuit. The voltage regulator maintains a predetermined constant voltage ($V_{so}$) between its sense terminal (input from the ideal diode circuit) and its output ($V_o$) to the light emitting diode. The value of $V_{in}$ must be more negative than that of $V_o$.

The voltage bias to the light emitting diode is conveniently shifted to a less negative value by means 26; the voltage bias is altered in a manner described further below and is useful in order to reduce the magnitude of $V_o$. Conveniently, three diodes connected in series as shown are employed, although other level shifting means may also be used.

The intensity of the electromagnetic radiation emitted by the light emitting diode is conveniently adjusted by means 27, which may be connected between (1) both the detecting means and input 20 of the diode circuit and (2) both the output of the three terminal voltage regulator and the voltage shifting means. Conveniently, a potentiometer is employed, although a resistor may alternatively be used if variation of output from the light emitting diode is not desired. The value of the adjusting means is not critical, other than it must develop a voltage which is proportional to the current flowing through it (i.e., act as a resistor).

The optical feedback circuit operates as follows, reference being made to the FIGURE:

1. Initially, the switch 15 is in position 1 so that the voltage at input 19 of the ideal diode circuit 18 is held at ground. The voltage at input 20 cannot be above ground ($V_{in}$ is negative), so the output 21 of the ideal diode circuit is controlled by input 19 and held at ground. The output of the voltage regulator 25 $V_o$, is below ground by $V_{so}$ volts, which is the voltage the regulator maintains between its sense terminal and its output terminal. The voltage at the diode laser 11 is level shifted approximately $V_{so}$ volts above $V_o$ by voltage shifting means 26, so the output current to the laser is small (typically considerably less than 1 mA).

2. When the switch is thrown to position 2, the voltage at input 19 of the ideal diode circuit begins to ramp toward the negative input voltage ($V_{in}$) with a slow R-C time constant. The output of the voltage regulator also ramps toward the negative supply, since this point is maintained $V_{so}$ volts below the sense terminal. The laser current and light output both increase as $V_o$ goes negative. This causes current to flow through the photodetector 16, which develops a voltage across the light level set potentiometer 27. When the laser light intensity reaches the point where the photodetector current causes a voltage drop across the potentiometer equal to $V_{so}$, the ideal diode circuit will have zero volts across it. If the laser light becomes greater than this value, input 20 of the ideal diode circuit becomes greater than input 19, and the sense terminal will follow input 20 of the ideal diode circuit. The time constant of the R-C voltage ramp is selected such that the ideal diode circuit, photodetector, and any other associated optical feedback circuitry, can equilibrate before the laser power can overshoot the desired set point. As described above, the time constant ranges from about 0.001 to 1 sec, and preferably about 0.1 to 1 sec. In this manner, the laser is transferred from an off state to a desired light output level with no significant overshoot or turn-on transients.

Laser turn-off is initiated by returning the switch 15 to position 1. Input 19 of the ideal diode circuit will ramp from the negative input voltage toward ground. When input 19 becomes greater than input 20, the output 21 of the ideal diode circuit (and voltage regulator) will follow the ramp until the laser current is again small.

Optical feedback light controllers of this type have been used in the past with incandescent lamps (see National Semiconductor Linear Databook, 1976, page 1-34). The unique and innovative features of the present circuit are in the turn-on and turn-off techniques. These are particularly important with diode lasers, which can be destroyed by small output current overshoots lasting for only a microsecond or less. The use of a slow voltage ramp which increases laser power slowly, with automatic switch-over to optical feedback at a specified operating point, is considered novel.

For light output of 5 mW (a typical value) and assuming 100% of the emitted electromagnetic radiation is captured by the photodetector with a sensitivity of 0.3 A/W, thereby generating 1.5 mA, the potentiometer can be turned to any point desired. The light output of the laser is stabilized such that detector current times resistance set on the potentiometer is equivalent to $V_{so}$. The value of resistor 13 is conveniently 10 K$\Omega$ and the value of capacitor 14 is 50 $\mu$F, thereby providing a time constant of about 0.5 sec. In the ideal diode circuit shown, the resistance of resistor 22 is conveniently 10 K$\Omega$. The diode 23 is not critical; an example is 1N914. The operational amplifier 24 is conveniently one such as LM101. The level shifting diodes 26 are also not critical, examples of which may be 1N4719 and the photodetector 16, also not critical, is conveniently a PIN10D available from United Detector Technology Inc., Santa Monica, CA. The three terminal regulator 25 is in an LM337. The light intensity set potentiometer 27 is conveniently 10 K$\Omega$.

For a three terminal regulator LM337, $V_{so}$ is 1.25 V. At the wide open (minimum light output) setting on the potentiometer at 10 K$\Omega$, 0.125 mA is required from the photodetector to obtain 1.25 V across the potentiometer. Throwing the switch from position 1 to position 2 gradually increases the laser power; about 0.5 to 1 sec are needed to reach the set point on the potentiometer. The current exponentially approaches a level such that the detector current is 0.125 mA at its maximum. Substantially no overshoots or transients are observed.

What is claimed is:

1. Transient suppression circuit for substantially eliminating transients or overshoot during turn-on/turn-off of a light emitting diode comprising:
   (a) a voltage input means for providing a bias to the light emitting diode, the voltage input means including a time delayed portion which provides a first voltage whose magnitude increases with time;
   (b) detecting means for detecting electromagnetic radiation emitted by the light emitting diode, said detecting means generating a second voltage in response to the detected radiation of the light emitting diode;
   (c) diode circuit means including at least one diode coupled between an output of said delay portion and an output of said detecting means to receive said first and second voltages and functioning to clamp an output of said diode circuit at a voltage substantially equal to the higher of said first and second voltages; and (d) voltage regulator means for regulating voltage to the light emitting diode and responsive to the voltage output of the diode circuit.

2. The circuit of claim 1 in which the time delayed portion of the voltage input is delayed by about 0.001 to 1 sec.

3. The circuit of claim 2 in which the time delay is about 0.1 to 1 sec.

4. The circuit of claim 1 in which the light emitting diode is a diode laser.

5. The circuit of claim 1 further including level shifting means for shifting the voltage to the light emitting diode to a less negative value.

6. The circuit of claim 1 further including means for adjusting a level of intensity of the electromagnetic radiation emitted by the light emitting diode.

7. Transient suppression circuit for substantially eliminating transients or overshoot during turn-on/turn-off of a diode laser comprising:

(a) voltage input means for providing a bias to the diode laser, the voltage input means including a time delayed portion which provides a first voltage whose magnitude increases with time and is delayed by about 0.001 to 1 sec;

(b) detecting means for detecting electromagnetic radiation emitted by the diode laser, said detecting means generating a second voltage in response to the detected radiation of the light emitting diode;

(c) an ideal diode circuit means including at least one diode serially coupled to an output of at least one operational amplifier, said ideal diode circuit means coupled between an output of said delayed portion and an output of said detecting means to receive said first and second voltages and functioning to clamp an output of said diode circuit at a voltage substantially equal to the higher said first and second voltages;

(d) voltage regulator means for regulating voltage to the diode laser and responsive to the voltage generated by the ideal diode circuit;

(e) level shifting means for shifting the voltage to the diode laser to a less negative value; and (f) means for adjusting the intensity of the electromagnetic radiation emitted by the diode laser.

8. The circuit of claim 7 in which the time delay is about 0.1 to 1 sec.

* * * * *